(12) United States Patent
Tsironis

(10) Patent No.: US 7,248,866 B1
(45) Date of Patent: Jul. 24, 2007

(54) FREQUENCY SELECTIVE LOAD PULL TUNER AND METHOD

(76) Inventor: Christos Tsironis, 44 Caribou Cr., Kirkland, Quebec (CA) H9J-2H8

(*) Notice: Subject to any disclaimer, the term of this patent is extended or adjusted under 35 U.S.C. 154(b) by 594 days.

(21) Appl. No.: 10/712,140

(22) Filed: Nov. 14, 2003

(51) Int. Cl.
*H04Q 7/20* (2006.01)

(52) U.S. Cl. .................. 455/423; 324/642; 333/248

(58) Field of Classification Search ............. 455/423, 455/424, 425; 324/642; 333/248
See application file for complete search history.

(56) References Cited

U.S. PATENT DOCUMENTS 6,297,649 B1 * 10/2001 Tsironis ............... 324/642
6,515,465 B2 * 2/2003 Kiyokawa et al. ....... 324/76.49

OTHER PUBLICATIONS

Brown, J. "Coaxial Tuners Control Impedance to 65GHz", Microwaves & RF, Jan. 2003, pp. 97-100, vol. 42, No. 1, Penton Media Inc., Cleveland, OH, USA.

ATN Microwave Inc., "A Load Pull System with Harmonic Tuning", Microwave Journal, Mar. 1996.

Tsironis, C. "System Performs Active Load-Pull Measurements", Microwaves & RF, Nov. 1995, p. 102-108.

"Device Characterization with Harmonic Source and Load Pull", Maury Microwave Inc., Dec. 2000.

Tsironis, C. "Product Note 44: Programmable Harmonic Tuner, PHT", Focus Microwaves, Inc., Nov. 1997.

* cited by examiner

*Primary Examiner*—Lee Nguyen

(57) ABSTRACT

An automatic, frequency selective microwave tuner, used for load pull transistor testing, is capable of generating independently controllable reflection factors, both in amplitude and phase, at several, harmonic or not, frequencies simultaneously. The tuner employs horizontally and vertically adjustable high Q resonant probes and replaces, when used in harmonic load pull set-ups, otherwise required combinations of wide-band tuners with harmonic rejection tuners or wide-band tuners and frequency discriminators (diplexers or triplexers).

8 Claims, 19 Drawing Sheets

Figure 1: PRIOR ART, Load Pull set-up using passive tuners (simplified)

Figure 2: PRIOR ART: Load pull set-up using active load (shown only DUT output side)

Figure 9: Partly Prior Art

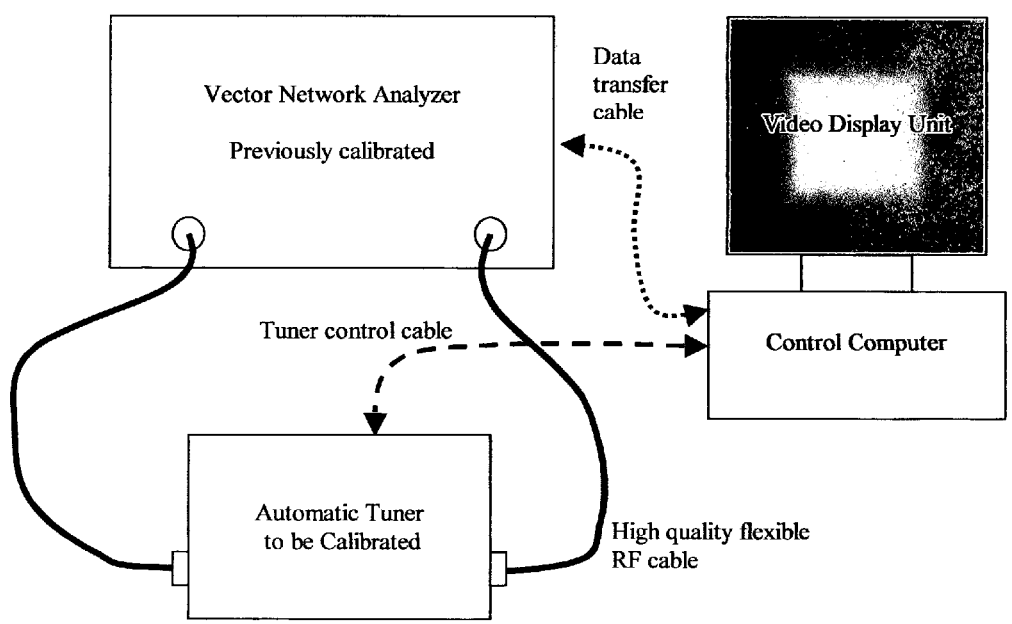
Figure 19: Prior Art

FREQUENCY SELECTIVE LOAD PULL TUNER AND METHOD

PRIORITY CLAIM

Not Applicable

CROSS-REFERENCE TO RELATED ARTICLES

[1] Brown, J. "Coaxial Tuners Control Impedance to 65 GHz", Microwaves & RF, January 2003, pages 97-100, Vol. 42, No. 1, Penton Media Inc., Cleveland, Ohio, USA.
[2] ATN Microwave Inc., "A Load Pull System with Harmonic Tuning", Microwave Journal, March 1996.
[3] Tsironis, C. "System Performs Active Load-Pull Measurements", Microwaves & RF, November 1995, page 102-108.
[4] "Device Characterization with Harmonic Source and Load Pull", Maury Microwave Inc., December 2000.
[5] Tsironis, C. "Product Note 44: Programmable Harmonic Tuner, PHT", Focus Microwaves, Inc., November 1997.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to a manual or automatic microwave tuner to be used mainly in harmonic load pull testing of power transistors by being able to synthesize the amplitude and phase of selected impedances at each harmonic frequency independently.

Modern design of high power microwave amplifiers and oscillators, used in various communication systems, requires accurate knowledge of the active device's (microwave transistor's) characteristics. In such circuits, it is inadequate for the transistors operating in their highly non-linear region, close to power saturation, to be described using non-linear analytical or numerical models.

A popular method for testing and characterizing such microwave components (transistors) in the non-linear region of operation is "load pull". Load pull is a measurement technique employing microwave tuners and other microwave test equipment. The microwave tuners are used in order to manipulate the microwave impedance conditions under which the Device Under Test (DUT, or transistor) is tested (FIGS. 1 and 2).

When transistors operate in their non-linear range at high power and close to saturation, signal distortion inside the transistors creates significant harmonic frequency signal components that reduce the efficiency and the signal transmission purity of the communication system. In order to improve and optimize the performance of such transistors under these operating conditions, the tuners used to test these DUT must also provide for independent control of the impedance at the harmonic frequencies, or "harmonic impedances". If such tuners are used, then the load pull system described above becomes a "harmonic load pull system" (FIGS. 1 and 2).

There are essentially two methods that allow generation and manipulation of microwave impedances presented to the DUT:

A. Using electro-mechanical [1] or passive electronic tuners [2], leading to "passive load pull" (FIG. 1); and;

B. Active tuners, leading to "active load pull" [3], (FIG. 2).

Electro-mechanical tuners [1] have a number of advantages compared to active tuners, such as long-term stability, higher handling of microwave power, easier operation and lower cost. Such tuners use adjustable mechanical obstacles (probes) inserted into the transmission media of the tuners in order to reflect part of the power coming out of the DUT and to create a "real" impedance presented to the DUT.

Passive electronic tuners have been used in the past, but they provide limited tuning range and handling power and do not offer any significant benefit within the scope of this invention.

Existing passive electro-mechanical tuners, as used in set-ups shown in FIG. 1, use a tuning mechanism, as shown in cross section in FIG. 5; in this configuration the capacitive coupling between the vertical probe (81) and the central conductor (83) of the slotted airline (slabline, 77, 78) creates a wideband reflection, that can be adjusted by changing the distance between the bottom of the probe (81) and the central conductor (83).

The modifications of both the amplitude and phase of the reflection factors due to the capacitance change are wideband in nature and generate reflection factors at several harmonic frequencies. When the tuner is moving, the impedances at all harmonic frequencies change simultaneously, and since all harmonic reflections are generated by the same wideband RF probe in the tuner, there is a natural and fixed relationship between them.

This makes it impossible to control the impedances at the harmonic frequencies independently. However, independent tuning of the impedances at the harmonic frequencies is a key requirement of a harmonic load pull test system. Therefore, it is impossible to perform harmonic load pull without the use of frequency path separation before the tuners by means of frequency discriminators, such as di- or tri-plexers, which would separate the signals at the various harmonic frequencies of interest, before they reach the tuners.

Active tuners (FIG. 2) are assemblies of microwave circuits and components that include at least one microwave amplifier, a phase shifter and a variable attenuator. These assemblies sample signals coming out of the DUT, using typically a directional coupler, and return them to the DUT after amplifying the signals and modifying their amplitude and phase. This generates a "virtual" reflection factor for the DUT. Active tuners use band-pass filters in their circuits and are, therefore, able to separate the various frequencies coming out of the DUT and thus synthesize harmonic impedances independently. Their disadvantage lies in much higher complexity and price than passive tuners, as well as power limitations and tendency for spurious oscillations.

As mentioned before, in order to manipulate the harmonic impedances, a passive load pull test system needs either some kind of frequency separation, between the tuners and the DUT or frequency selective tuners. In the absence of frequency selective tuners, frequency separation is achieved by using frequency discriminators, like frequency diplexers or triplexers. These components must be connected between the DUT and the actual tuner, introducing insertion loss that reduces the effective reflection factor effectively presented by the tuners to the DUT.

Frequency selective tuners, on the other hand, could be connected directly to the DUT and synthesize harmonic frequencies independently. At this point of time, frequency selective tuners, capable of changing the amplitude and phase of reflection factors at harmonic frequencies and capable of being used in harmonic load pull set-ups, are not known.

DESCRIPTION OF PRIOR ART

At this point of time, two methods for this type of frequency separation testing using passive tuners are being used: Harmonic load pull using di- or triplexers and harmonic rejection tuners.

A typical harmonic load pull test set-up using frequency separation by means of di- or tri-plexers is shown in FIG. 3. It contains a signal source (1) that injects an adjustable amount of RF power into the test system at a fundamental frequency (fo). The source is connected to the input port of the test set-up, which includes a first harmonic tuning block (2). This block (2) typically contains up to three automatic tuners (4, 5 and 7) and a frequency tri-plexer (6). A di-plexer combined with only two tuners for controlling only two frequencies can also be used in a simplified version of the set-up. The output of the tri-plexer (6) is connected to the input port of the DUT (8).

The output port of the DUT (8) is connected to the input port of the output harmonic tuning block (3). Again this block (3) contains up to three automatic tuners (9, 10 and 13) and a tri-plexer (12). After passing through tuner (10), the signal reaches the load of the set-up (11), which is typically the sensor of a microwave power meter. In this set-up, tuner (4) at the input side and tuner (10) at the output side are operating at the fundamental frequency (fo), whereas tuners (5) and (7) at the input side and tuners (13) and (9) at the output side are operating at the harmonic frequencies, which are typically 2fo and 3fo, but can also be higher harmonics, like 4fo, 5fo, etc. By manipulating the tuners in this set-up, the harmonic impedances can be adjusted separately from each other and the DUT can be characterized as a function of those impedances. This optimizes the DUT's performance for a specific amplifier design.

The main advantage of the test set-up in FIG. 3 is the fact that the frequency discriminator (di- or tri-plexer) effectively separates the frequency bands at the harmonic frequencies from each other and allows independent tuning of the harmonic impedances. The use of normal slide-screw tuners for all harmonics allows manipulation of both the amplitude and the phase of the reflection factors presented to the DUT. The main disadvantage of this set-up is that the frequency discriminator introduces transmission loss in the signal path before and after the DUT and thus reduces the effective reflection factor available at the DUT. Another practical disadvantage of this set-up is the difficulty in manufacturing good tri-plexers at the various frequency bands required by many applications.

A typical harmonic load pull test system using harmonic rejection tuners is shown in FIG. 4. The system contains a signal source (14) that injects an RF signal at the fundamental frequency (fo) into the input port of the test set-up. The test set-up contains an input harmonic tuning block (15), an output harmonic tuning block (18), a DUT (22) and a load (21), which is typically the sensor or an RF power meter. Each of the harmonic tuning blocks, (15) and (18), comprises one wideband tuner, (16) and (20) respectively, and one harmonic rejection tuner, (17) and (19) respectively. The wideband tuners serve to manipulate the reflection factors at the fundamental frequency (fo). Whereas the harmonic rejection tuners (17) and (19) serve to manipulate the reflection factors at the harmonic frequencies, typically 2fo and 3fo, or higher, like 5fo, 7fo, etc. The harmonic rejection tuners [5] reflect all of the RF power at the harmonic frequencies (2fo, 3fo, etc.) back into the DUT (22). Therefore, there is practically no RF power at the harmonic frequencies left to reach the wideband tuners, (16) and (20) and create a measurable reflection factor at the harmonic frequencies.

The advantages of this set-up is that it is simpler to assemble and calibrate than the set-up of FIG. 3, and does not include lossy components between the tuners, (16) and (20), and the DUT (22), thus allowing for a maximum reflection factor to be presented to the DUT. The disadvantage of the set-up is that the harmonic rejection tuners used allow for control of the phase but not the amplitude of the reflection factor at the harmonic frequencies. Even though this amplitude control of the reflection factor can be passed by for most practical tests, some users prefer to have this capability, which is possible using the set-up described in FIG. 3.

Existing electro-mechanical tuners are slide-screw tuners and use basically the same form of RF probes (slugs). FIG. 5 shows the cross section of the tuning area of a wideband, slide-screw tuner. The probe (81) moves inside a slotted airline or parallel-plate airline (slabline) (77, 78) in the middle of which is the center conductor (83). When the probe (81) moves closer to the central conductor (83), a variable, controllable, capacitive load is created in the air-gap (82). This change in capacitance permits to control the amplitude of the microwave reflection factor seen at the input port of the tuner (32) in FIG. 8.

When moving the probe parallel to the axis of the airline, the phase of the reflection factor is modified and thus any impedance on the Smith Chart can be reached. The reflection factor generated by this form of RF probe (slug) is wideband, covering more than 1 octave and typically two to three octaves. Consequently, reflection factors at harmonic frequencies, which by definition are separated by one octave (f2:f1=2), cannot be controlled independently.

Existing Harmonic Rejection tuners [5] also use a slide screw mechanism for controlling the phase of the reflection factor (FIG. 6). The RF probes are open stabs (85) and move along the slabline in permanent galvanic contact with the central conductor (87). The length (92) of the RF probes is adjusted to be one-quarter wavelength of the harmonic frequency, which they aim to reject, in order to transform the open end of the stab into a short circuit at its base (86), which is the point of contact with the central conductor. This type of tuner creates a reflection factor close to 1 (total reflection) at the resonance frequency, and allows the control of only the phase of the reflection factor, but not its amplitude.

In order to combine the frequency separation capability of harmonic rejection tuners (FIGS. 4, 6) with the control of amplitude and phase of the frequency tri-plexer set-up (FIG. 3), we propose a new tuner structure, which we call "frequency selective tuner", that allows frequency selective reflection of microwave signals with the possibility to adjust both the amplitude and phase of the reflection factors, and can be connected directly on the output or input ports of the DUT, thus avoiding lossy interconnections.

BRIEF SUMMARY OF THE INVENTION

This invention concerns a new type of electro-mechanical tuner, the "frequency selective load pull tuner". This new tuner type has the capability to reflect RF power transmitted through a transmission airline at three frequencies selectively and independently, and allows adjustment of the amplitude and phase of the reflected power. This creates variable impedances at harmonic frequencies, in order to present them to a DUT to be tested under high power (nonlinear) conditions.

A complete frequency selective load pull tuner, including sections for all three harmonic frequencies (fo and typically, but not exclusively, 2fo and 3fo) is shown in FIG. 11. The resonators (104, 105, 106) of the frequency selective tuner can be adjusted to reflect any frequency within the limits of the technology proposed, but for harmonic load pull the first three harmonic frequencies are typically the most important ones.

The frequency selective tuners can be used to configure a harmonic load pull test set-up as shown in FIG. 12. This set-up includes a signal source (95) that injects a single frequency signal into the test set-up via the input frequency selective tuner (96). This can be used to adjust amplitude and phase of the reflection factor seen by the DUT at its test port at the three harmonic frequencies fo, 2fo and 3fo, independently from each other. The signal is then fed into the input port of the DUT (98) and then from the output port of the DUT into the output frequency selective tuner (97). This tuner can manipulate the amplitude and phase of the harmonic reflection factors (impedances) seen by the DUT at its output port, the same way, as does the input tuner (96). The signal is then fed through a (optional) band pass filter (133) into a microwave load (99), which is typically the sensor of a microwave power meter. In this set-up (FIG. 12), the frequency selective tuners (96) and (97) replace the whole frequency discrimination and tuning sections (2) and (3) of the prior art set-up in FIG. 3.

The use of a band-pass, or low-pass filter (133) in front of the power sensor of the microwave load (99) is recommended in order to avoid measurement errors, due to detection of harmonic components in the output signal. This band-pass filter is not required in both prior art set-ups of FIG. 3 and FIG. 4, because in those set-ups the harmonic frequency components are filtered out either by the triplexer or by the harmonic rejection tuners. A low-pass or band-pass filter is easy to manufacture using standard techniques and readily available for frequency ranges.

BRIEF DESCRIPTION OF THE SEVERAL VIEWS OF THE DRAWINGS

The invention and its mode of operation will be more clearly understood from the following detailed description when read with the appended drawings in which:

FIG. 19 depicts prior art, a typical set-up used to calibrate electro-mechanical microwave tuners employing a control computer and a calibrated vector network analyzer.

DETAILED DESCRIPTION OF THE INVENTION

Figure 9:
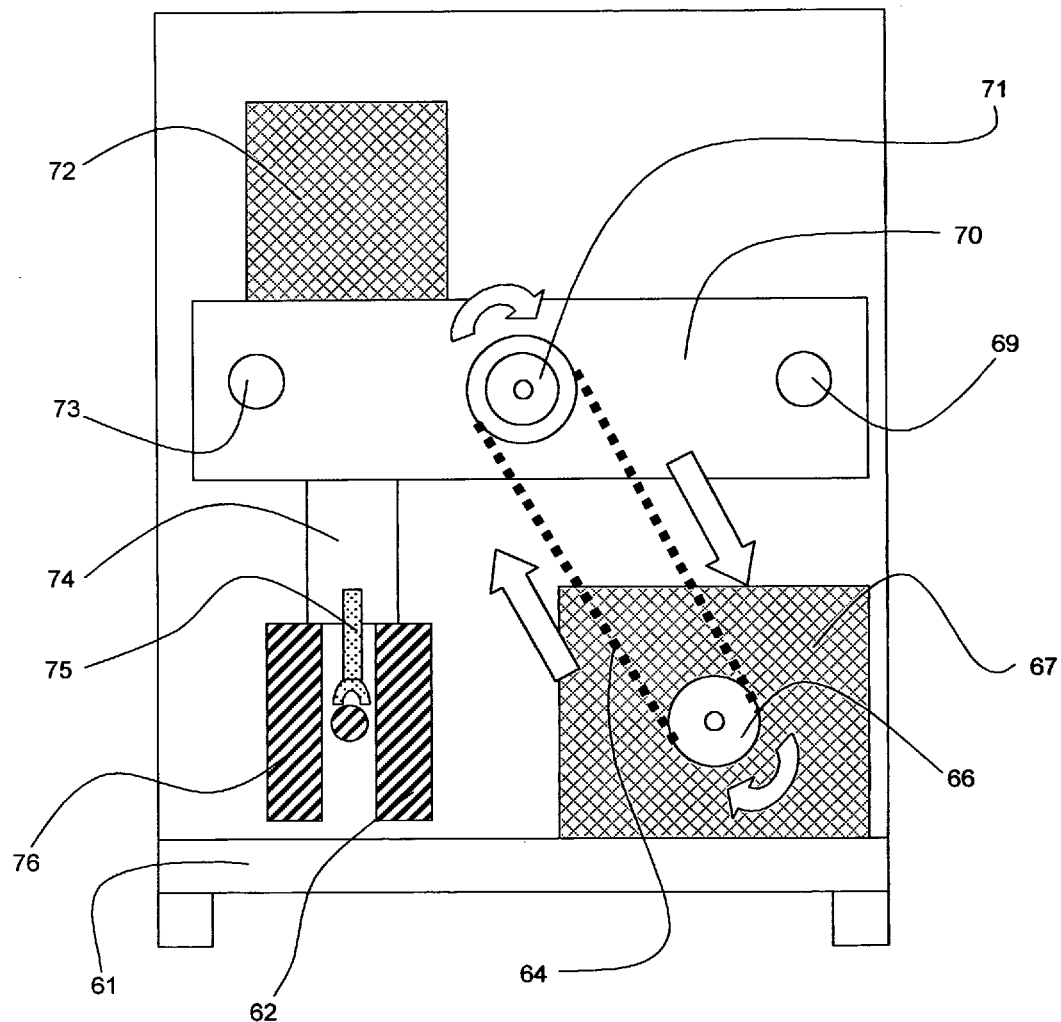
FIG. 9 depicts a side view of the horizontal movement mechanism of a frequency selective tuner (prior art)

We propose an electro-mechanical microwave load pull tuner as shown schematically in FIG. 9 (side view) and 11 (front view), which comprises a slotted transmission airline (101) with a test port (100) and an idle port (114). The airline is mounted inside an enclosure (102, 107, 113), which also holds two lateral guides (73, 69, FIG. 9) and a translation mechanism (64, 66, 71), in the form of a horizontal screw (108, FIG. 11). The horizontal screw (108) is driven by a stepper motor (67, 103), which is fixed on the base (61, 102) of the tuner. The screw (108) and the guides (73, 69) carry a mobile carriage (70) that can be moved over the whole length of any of the three sections of the tuner (107-111, 111-112 and 112-113). Vertical walls (111, 112) separate the different sections of the tuner. The mobile carriage (70) carries an electrical stepper motor (72, 109), which employs a translation mechanism (51, FIG. 10) in order to move the resonator assembly (48, 56, 115, 58, FIG. 10) in vertical direction (52).

The carriage (70) of the tuner shown in FIG. 9 also carries, beyond the stepper motor (72), the adjustable resonant probe assembly (74, 75). This probe assembly (FIG. 7) consists of a cylindrical outside ground wall (57), inside of which there is the resonant probe itself comprising a base (58), a straight vertical stab (115) and a dielectric ring washer (56); the dielectric washer (56) supports the resonator stab (115) and base (58) as it is pulled up and down (24, FIG. 7) by the vertical motor drive (51, FIG. 10).

Figure 10:
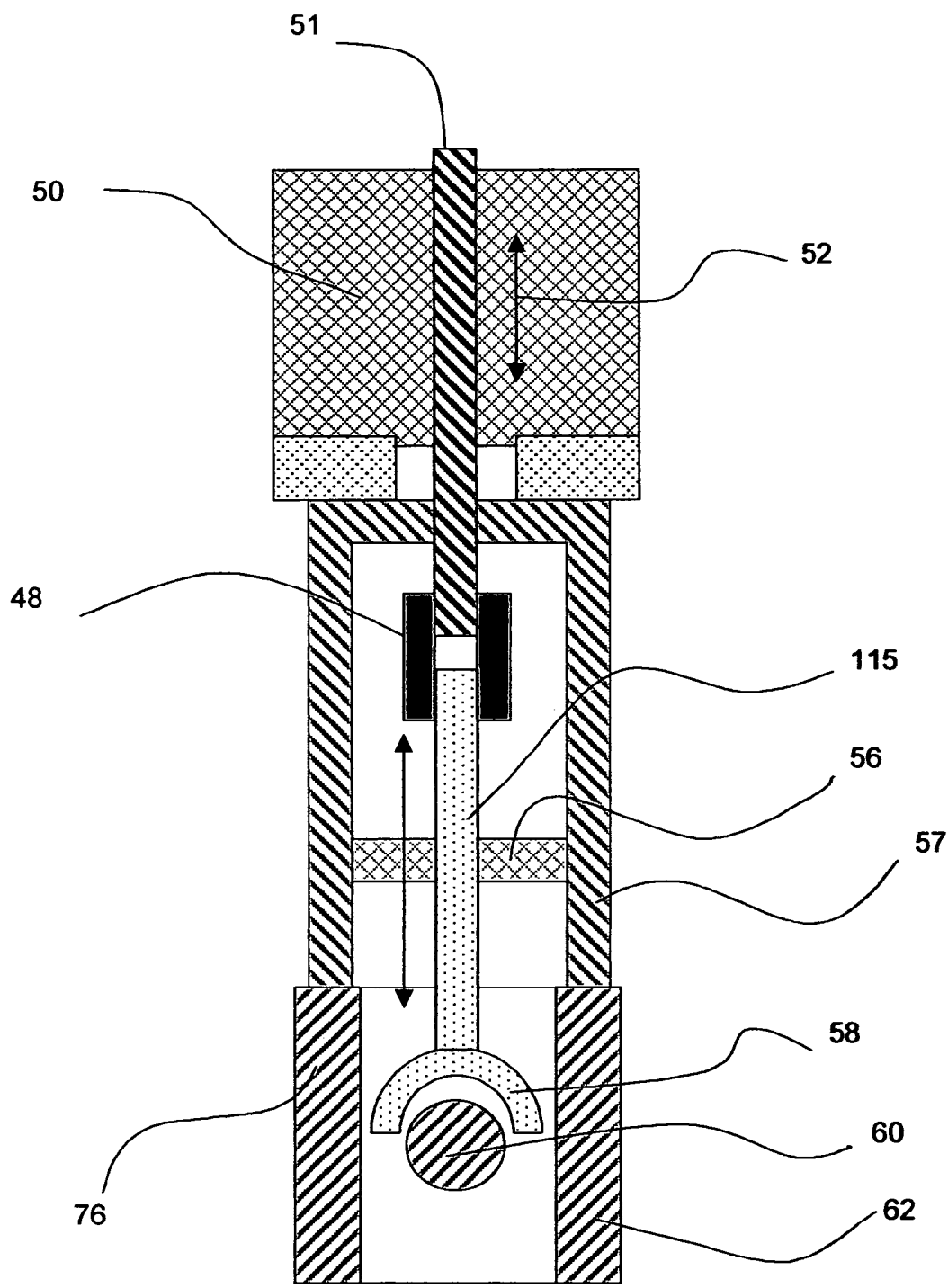
FIG. 10 depicts a cross section of the vertical movement mechanism of the RF probe of the frequency selective tuner.

The core of the frequency selective load pull tuner is the mobile resonant cavity (FIG. 10). The resonant cavity consists of a vertical member (115), which has a base (58) capacitively coupled with the central conductor (60) of the slabline (76, 62) and is held at its top end with a dielectric cylinder (48). This dielectric joint (48) does not affect the resonant properties of the stab (115) and allows the vertical screw (51) to raise and lower the resonator via the electric stepper motor (50). By changing the distance between the base (58) and the central conductor (60) the capacitive coupling between the resonator (58, 115) and the central conductor (60) changes and so does the amplitude of the reflection factor of the tuner.

Figure 8:
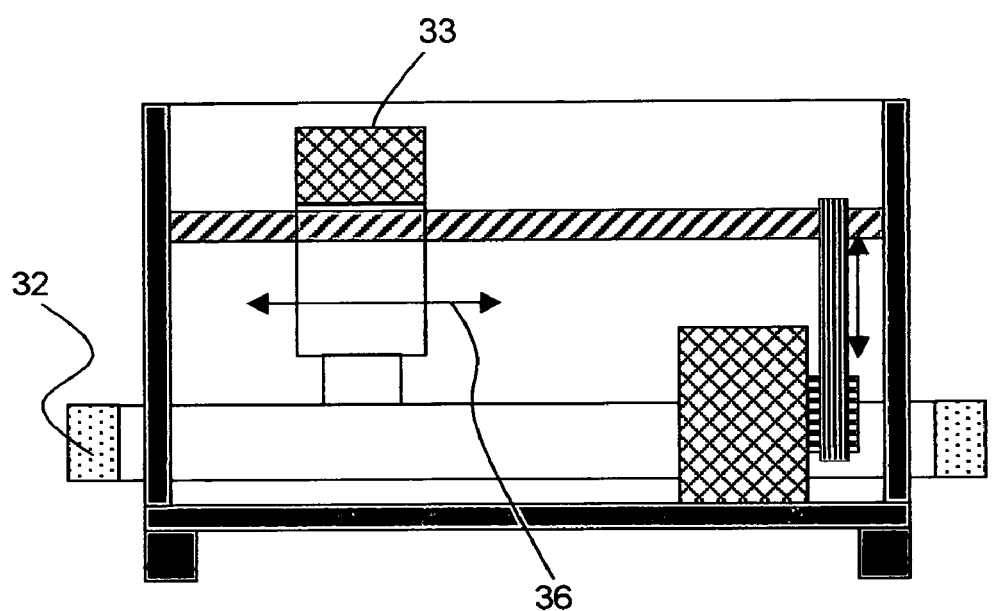
FIG. 8 depicts a front view of the horizontal movement mechanism of a frequency selective load pull tuner (prior art)
Figure 11:
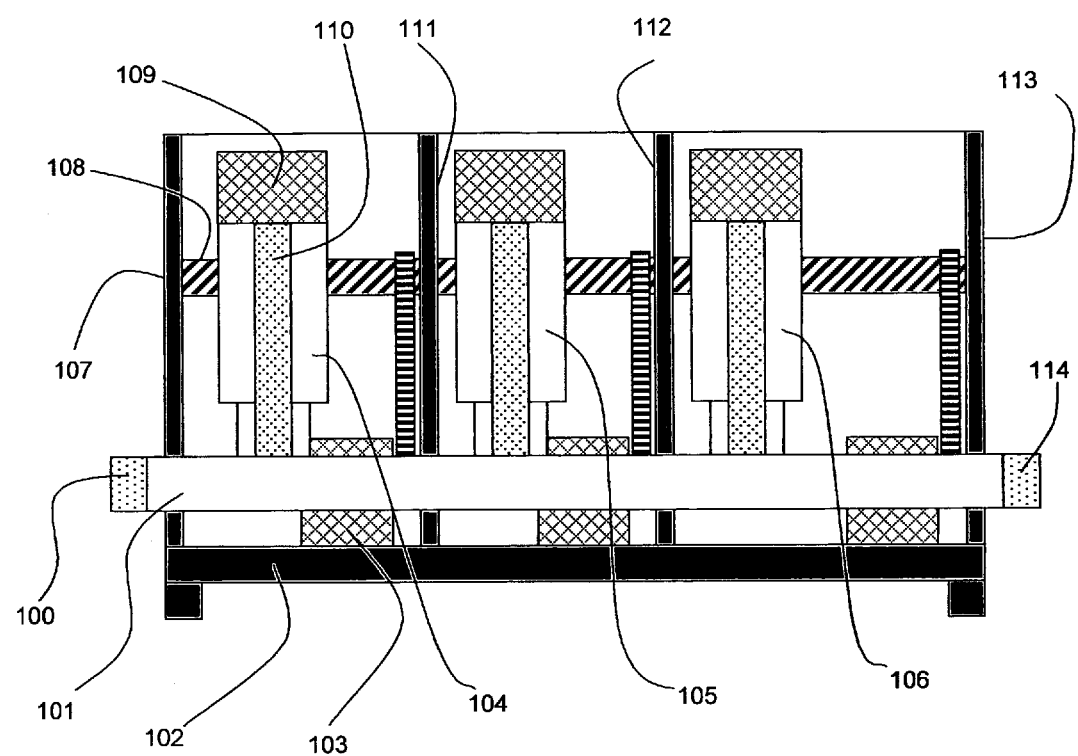
FIG. 11 depicts a front view of the frequency selective tuner, configured for three harmonic frequencies.
Figure 12:
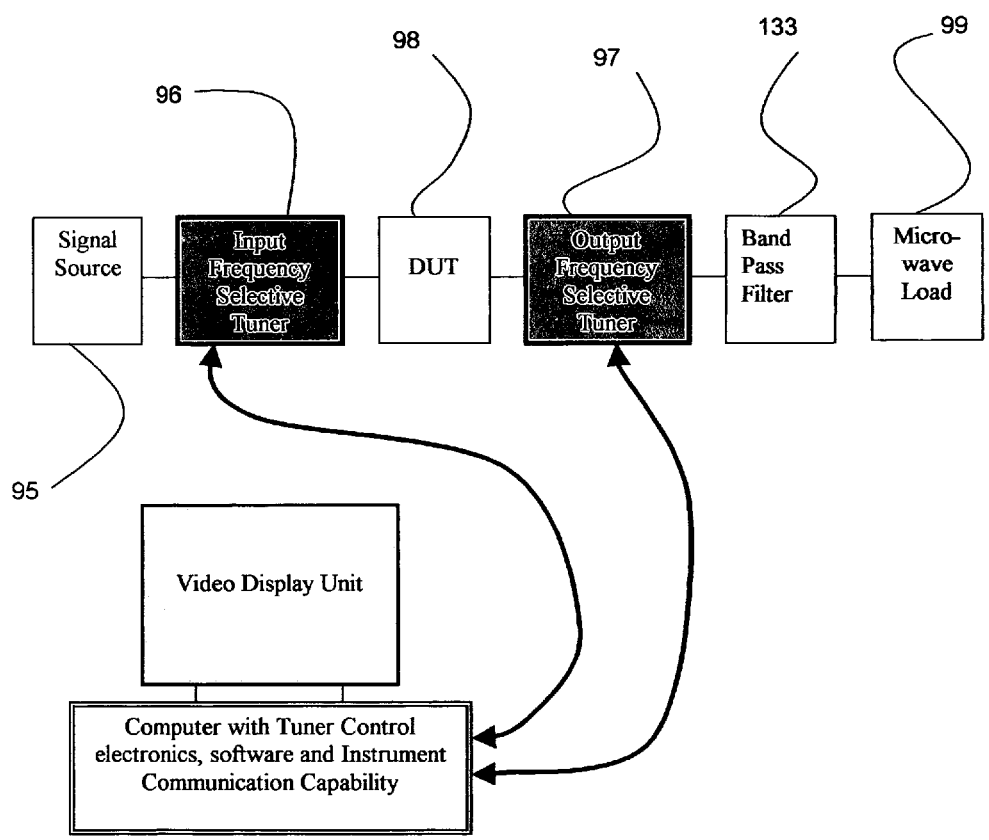
FIG. 12 depicts a schematic harmonic load pull test set-up configured using two frequency selective tuners.

As in prior art (FIG. 8), the carriage (33) can move horizontally (36) and carry with it the resonator assembly of FIG. 10. The horizontal displacement of the resonant probe controls the phase of the reflection factor and its vertical displacement controls the amplitude of the reflection factor. Both such displacements are performed using electric motors (103, 109 in FIG. 11). In fact, the preferred embodiment of this apparatus employs electrical stepper motors, because this type of motor allows accurate positioning and is compatible with digital electronic/software control. FIGS. 9 and 11 show side and front views of the horizontal movement mechanism and FIG. 10 shows a cross section of the vertical mechanism and the resonator assembly. Part of these basic mechanisms also corresponds to prior art.

Figure 1:
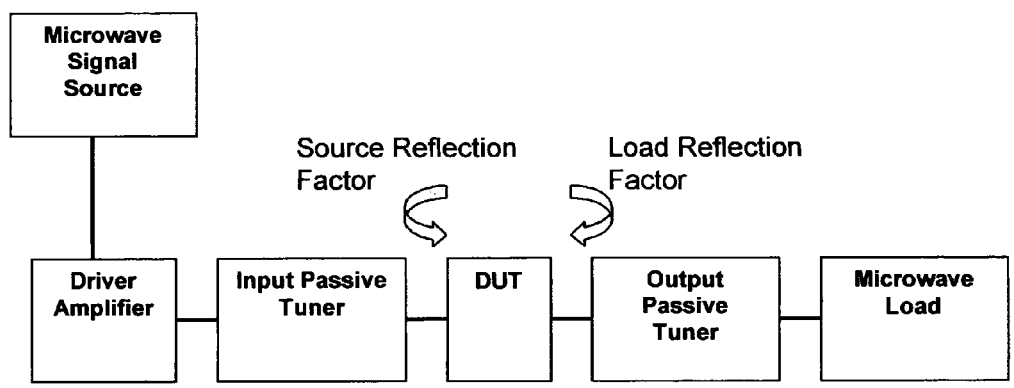
FIG. 1 depicts Prior Art, a load pull test set-up using passive electro-mechanical tuners
Figure 2:
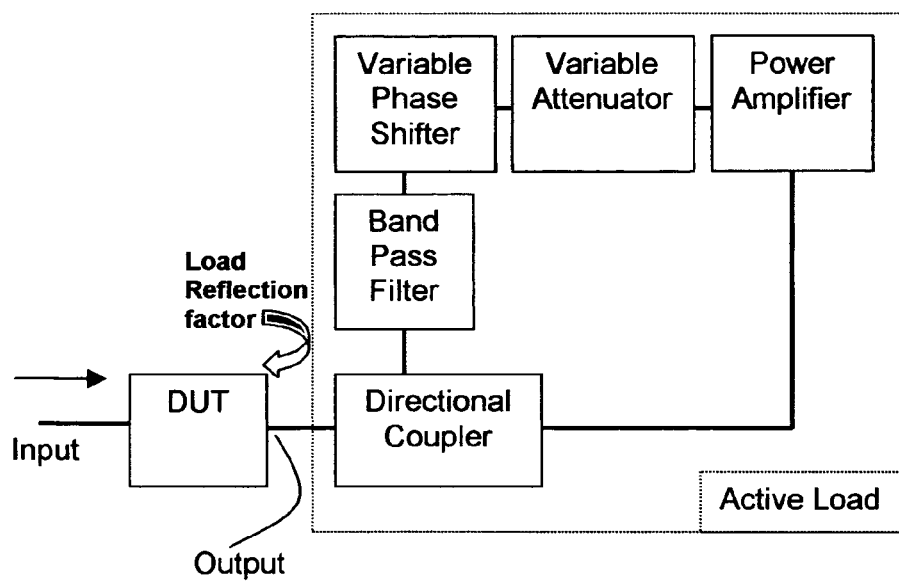
FIG. 2 depicts Prior Art, a load pull test set-up using active tuners (only output section is shown, the input section is symmetrical)
Figure 3:
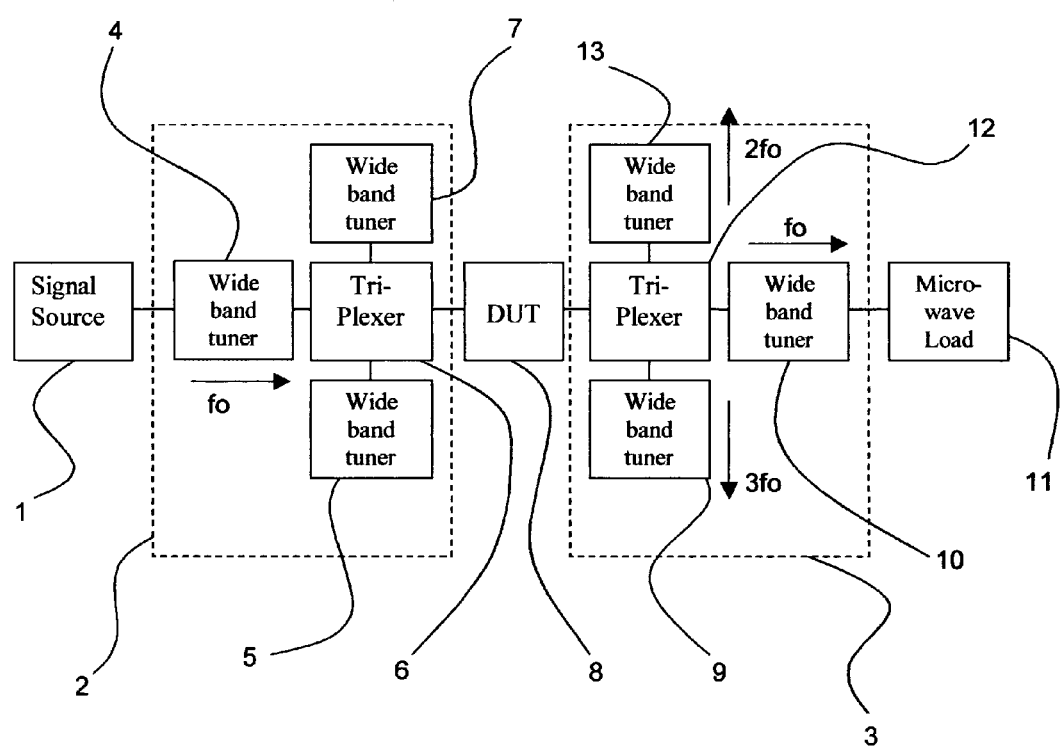
FIG. 3 depicts Prior Art, a harmonic load pull set-up using passive tuners and frequency discriminators (di- or triplexers)
Figure 4:
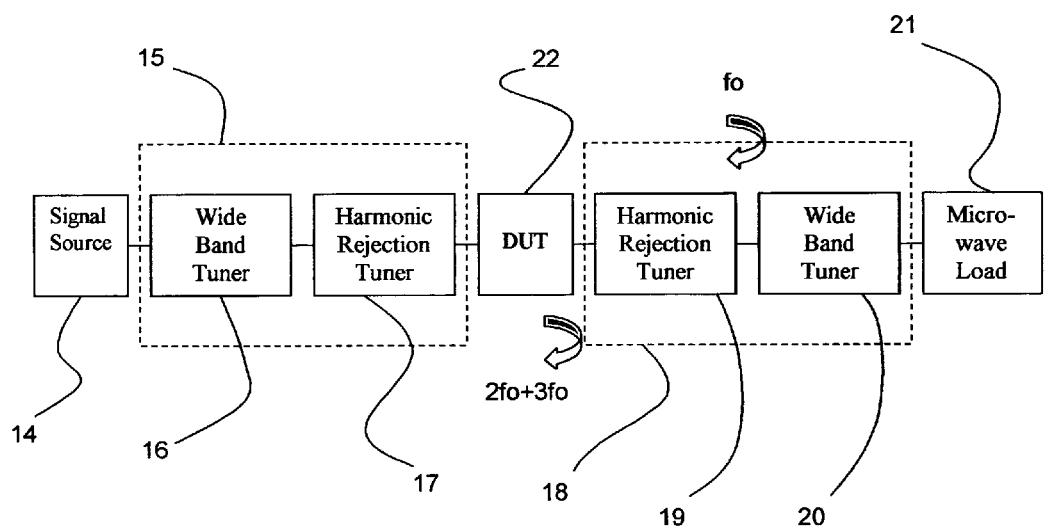
FIG. 4 depicts Prior Art, a harmonic load pull set-up using passive wideband and harmonic rejection tuners
Figure 5:
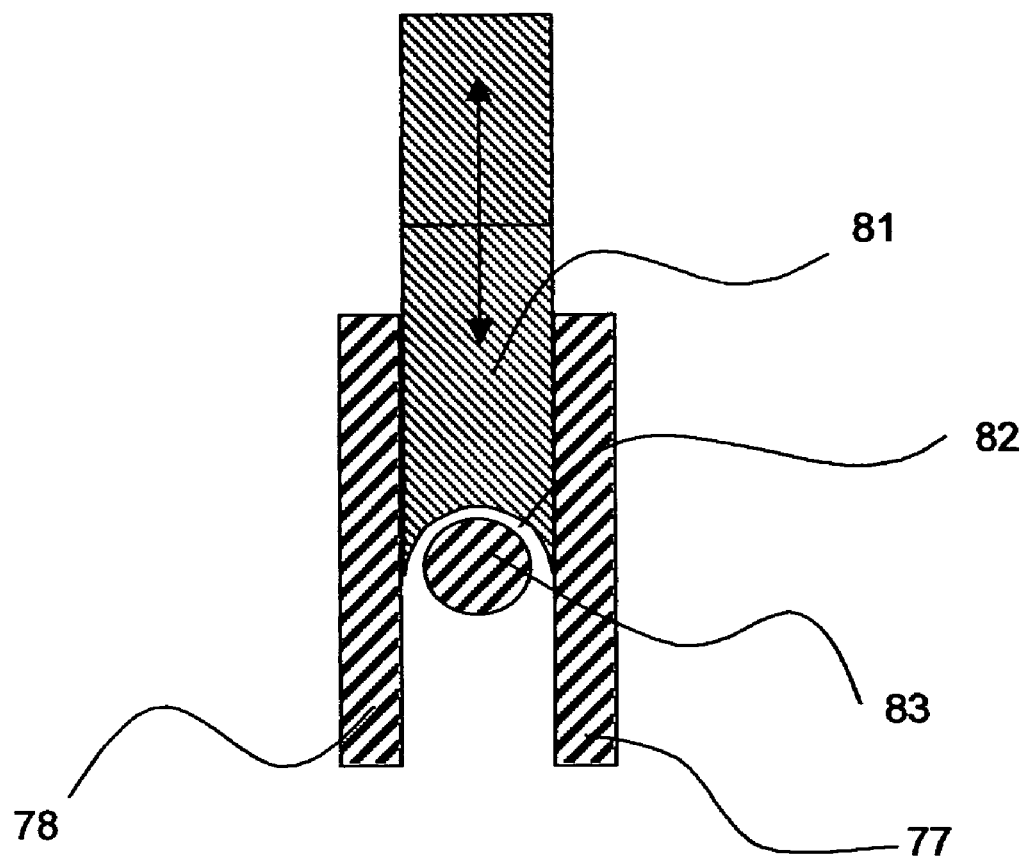
FIG. 5 depicts Prior Art, a cross section of the RF probe of a wideband slide screw tuner, as used in load pull set-ups
Figure 6:
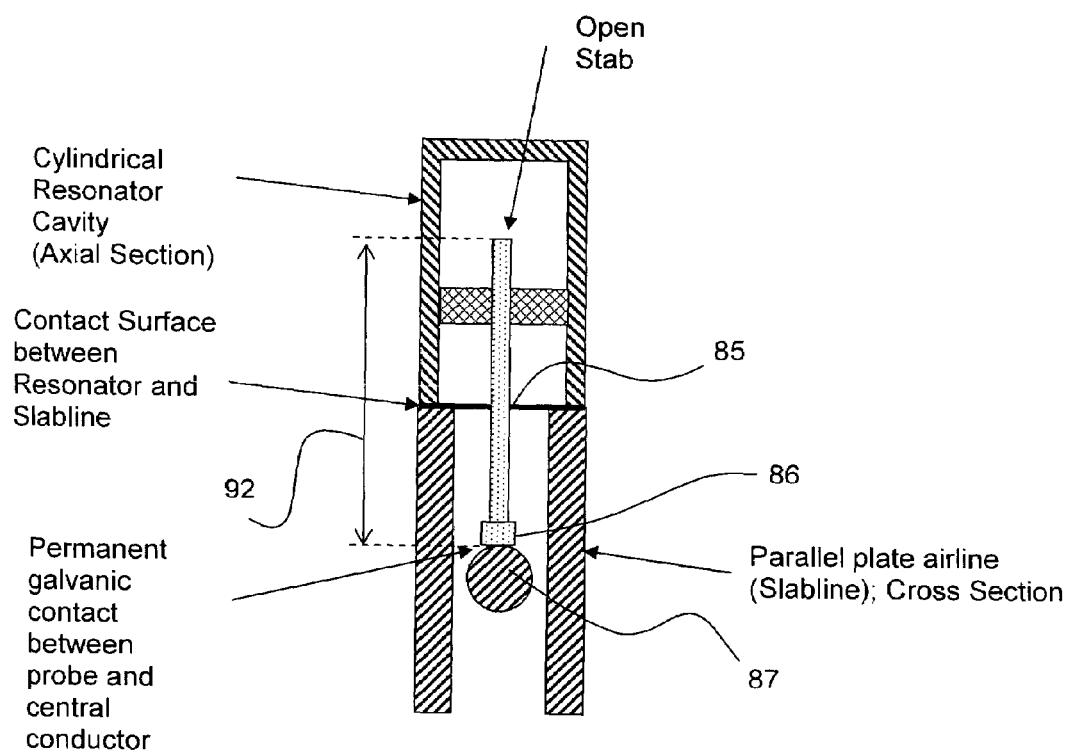
FIG. 6 depicts Prior Art, a cross section of the RF probe of a harmonic rejection tuner, as used in harmonic load pull set-ups
Figure 7:
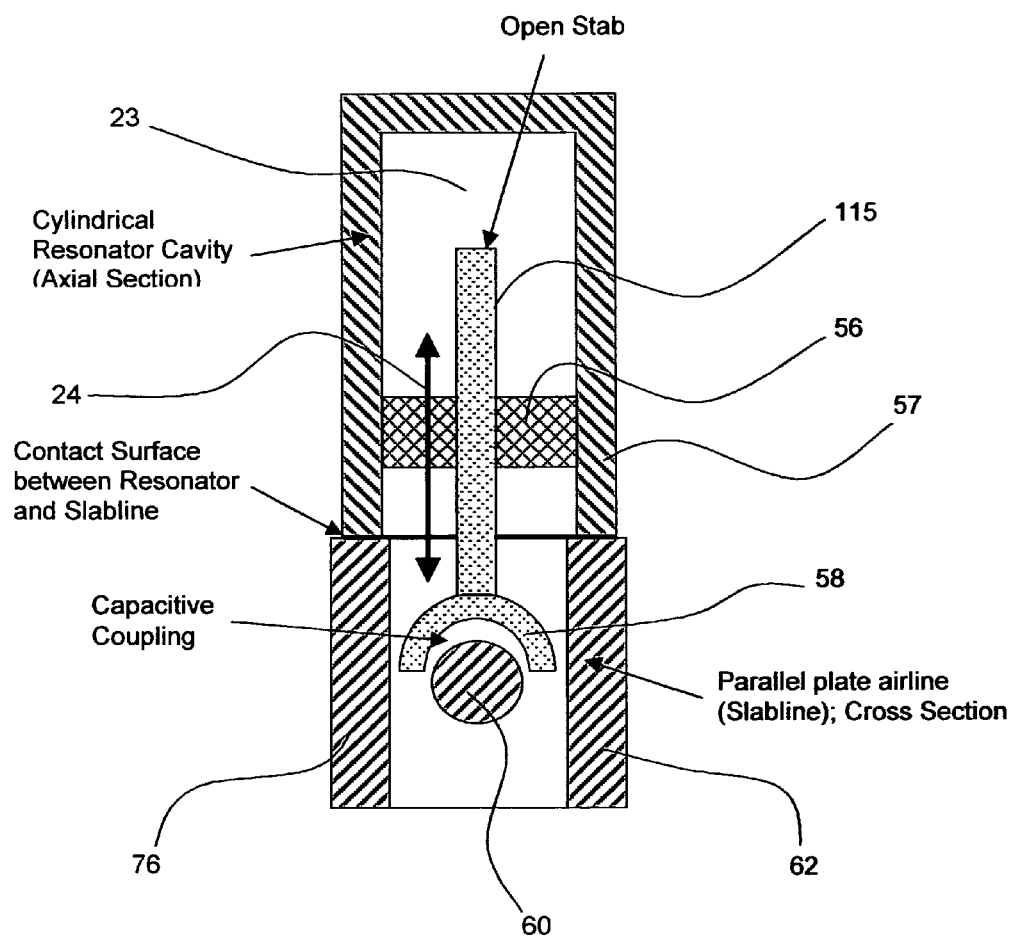
FIG. 7 depicts a cross section of the microwave probe of a frequency selective load pull tuner

The resonant probe slides along the slotted airline as shown in FIGS. 7, 10, and 11 in such a way as to establish reliable and continuous RF ground contact between the top of the slabline (76, 62, FIG. 7) and the outside wall (57) of the resonant cavity (23) during the horizontal movement of the carriage.

A complete frequency selective load pull tuner may contain several carriages and resonator assembly modules (FIG. 11). This particular embodiment consists of three such modules. Each module is identical in structure and includes its own carriage (104), horizontal (103) and vertical (109) motors, as well as its own horizontal (108) and vertical (110) resonant cavities and translation mechanism. Each module is adjusted at a different resonance frequency.

The resonant cavities create a selective reflection as a function of frequency. The basic resonance used for this application is that of an open stab of one-quarter lambda length at the corresponding (fundamental or harmonic) frequency. At this frequency, the open circuit at the end of the resonant stab (115, FIG. 7) is transformed into a short circuit at the bottom of the stab where it joins the base (58). The capacitive coupling between the base (58) and the central conductor (60) then couples part of the short circuit to the central conductor (60) and attenuates the signal flow through the slabline.

Figure 13:
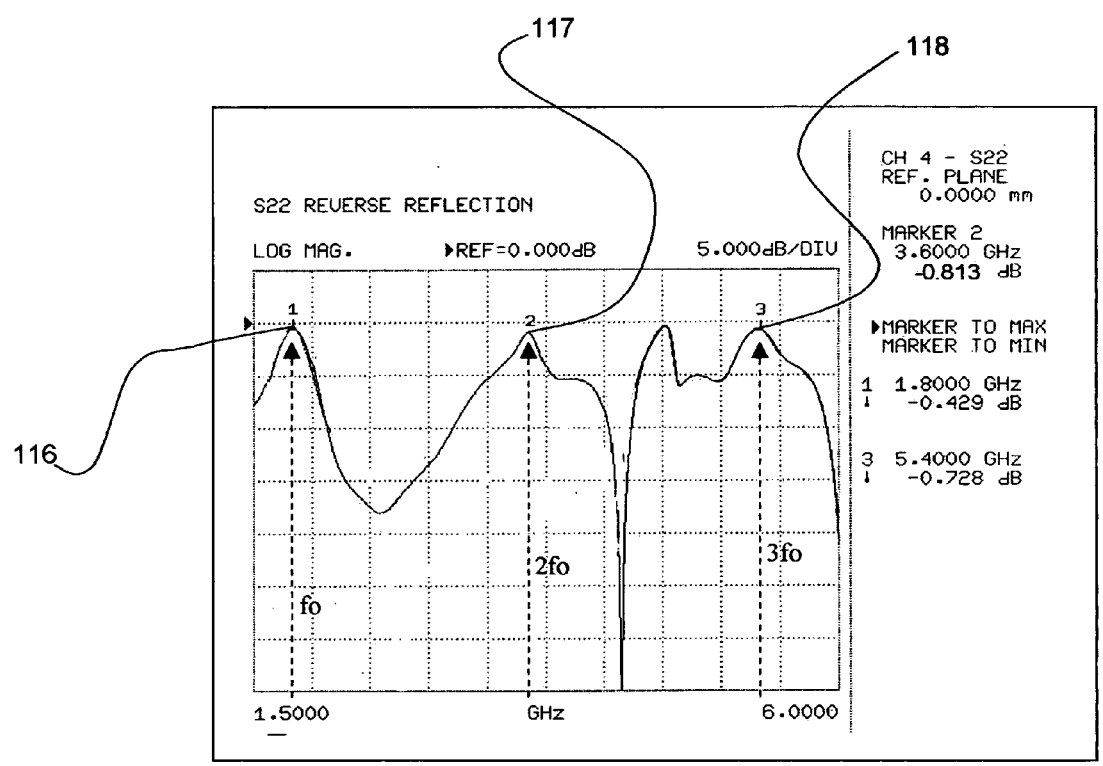
FIG. 13 depicts the frequency response of the reflection factor (S22) of a three-resonator frequency selective tuner with all probes set to maximum coupling (lowest position in the resonant cavity, closest to the central conductor of the slabline).
Figure 14:
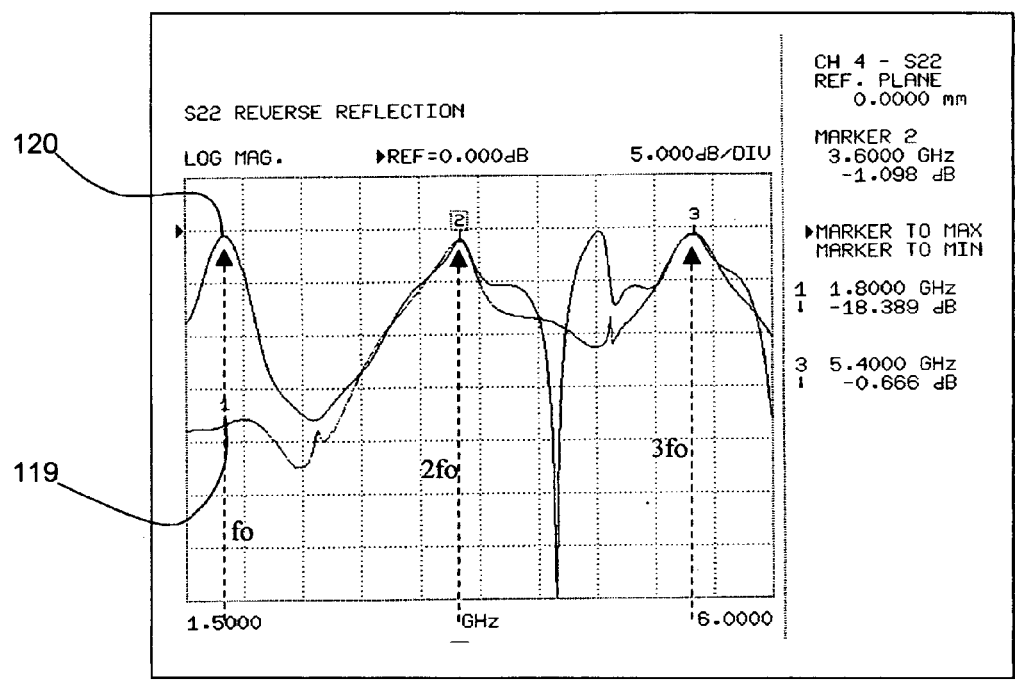
FIG. 14 depicts the frequency response of the reflection factor (S22) of a three-resonator frequency selective tuner with the probe adjusted to the fundamental frequency fo (1.8000 GHz) lifted for minimum coupling and two probes (2fo and 3fo) set to maximum coupling.
Figure 15:
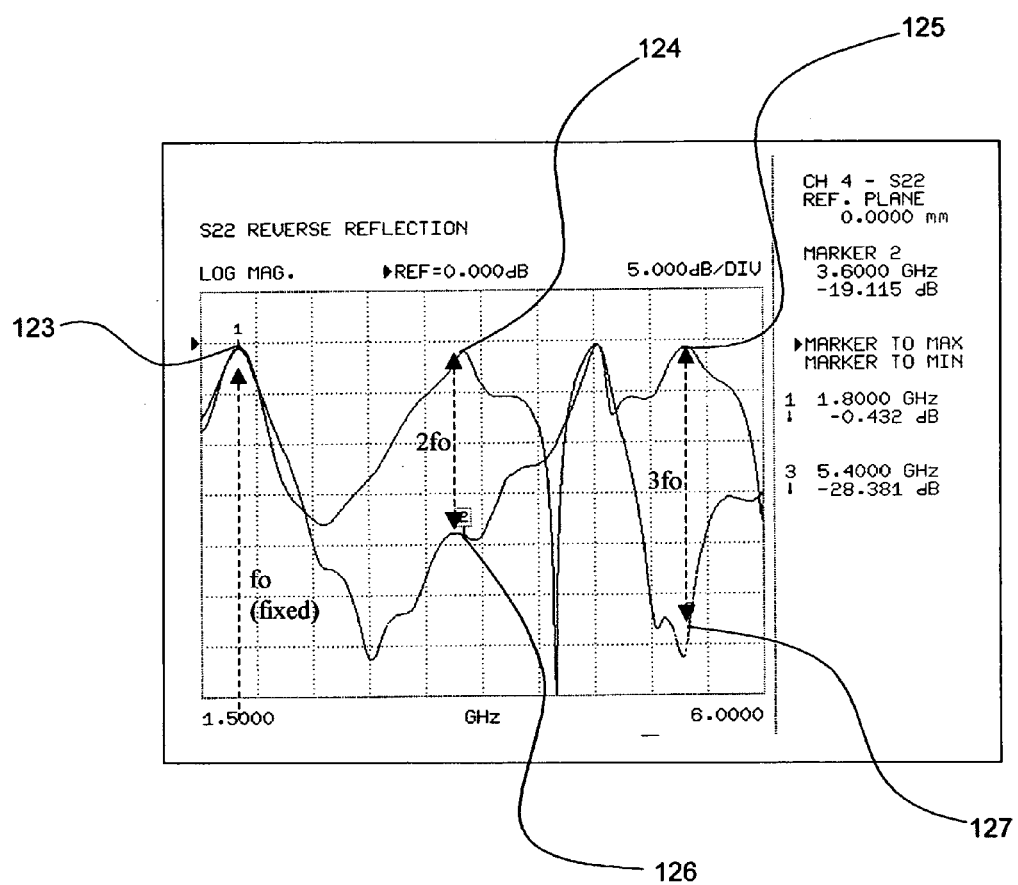
FIG. 15 depicts the frequency response of the reflection factor (S22) of a three-resonator frequency selective tuner with the probe adjusted to the second harmonic frequency 2fo (3.6000 GHz) lifted for minimum coupling and two probes (fo and 3fo) set to maximum coupling.

FIGS. 13 to 15 show typical frequency response of the reflection factor S22 of a three-resonator tuner. The reflection factors shown in FIGS. 13 to 15 are marked in Decibel (dB) relative to 1.0, which corresponds to 0 dB. The relation between the two numbers is $$S_{22}(dB)=20 \cdot LOG(S_{22}).$$

For example, a reflection factor $S_{22}$ of 0.5 corresponds to −6.021 dB. On the other hand converting logarithmic values to linear follows the formula $$S_{22}=10^{S_{22}(dB)/20}$$

or a reflection factor $S_{22}$ of −19.115 dB corresponds to a linear value of 0.1107.

The overall behavior of the frequency selective tuner of FIG. 11, when all resonators are driven closest to the central conductor for maximum coupling to highest reflection factor, is shown in FIG. 13. Markers 1 to 3 mark the selected frequencies. Marker 1 (116) corresponds to the fundamental frequency fo (1.8000 GHz), marker 2 (117) to the second harmonic 2fo (3.6000 GHz) and marker 3 (118) to the third harmonic 3fo (5.4000 GHz). It can be seen that the response of the tuner's reflection factor (or $S_{22}$, as measured by the network analyzer) is, in all three cases high, varying between −0.429 dB and −0.813 dB, which is the required performance for a load pull tuner.

By changing the distance between the base (58) and the central conductor (60) (FIG. 7), we mainly change the effect of the short circuit on the signal flow, but we also change slightly the resonance frequency. This can be seen on FIG. 14. FIG. 14 shows the reflection factor of the frequency selective tuner of FIG. 11 at the DUT-close port (test port). FIG. 14 contains two traces: trace (120) corresponds to a condition where all resonators are closest to the central conductor (=maximum reflection, same as FIG. 13), whereas trace (119) corresponds to a condition where the resonator at the fundamental frequency fo (marker 1, 1.800 GHz) is withdrawn. In this case two things happen:

1) The reflection factor at this frequency (1.8000 GHz) becomes minimum (value at marker 1=−18.389 dB) and 2) the resonance frequency, corresponding to the local peak of the trace (119), shifts to slightly higher values (right of the arrow pointing to the maximum of the trace (120). This happens because the reduced capacitive coupling with the central conductor in effect reduces slightly the effective electrical length of the resonator stab and thus increases its resonance frequency.

FIG. 14 also shows another very important behavior of this tuner: Markers 2 and 3 do not change between the two traces (119, 120), which means in fact that we can change the amplitude of the reflection factor at the fundamental frequency fo (marker 1 or 1.8000 GHz) without any measurable effect on the reflection factors at 2fo (marker 2 or 3.6000 GHz) and 3fo (marker 3 or 5.4000 GHz), which fulfills the basic requirement of this type of harmonic load pull testing.

FIG. 15 shows the behavior of this type of tuner when we withdraw the second (2fo) and the third (3fo) resonators, adjusted to reflect the second harmonic 2fo (marker 2 set to 3.6000 GHz) and third harmonic 3fo (marker 3 set to 5.4000 GHz) frequencies. Whereas trace (124) corresponds to the reflection factor ($S_{22}$) when all resonators are set to maximum reflection (same as trace 120 in FIG. 14), trace (126) corresponds to the situation where resonators 2 (2fo=3.6000 GHz) and 3 (3fo=5.4000 GHz) are withdrawn and create minimum reflection. Comparing points (124) and (126) on one side and (125) and (127) on the other side shows that we obtain a dynamic tuning capability of the order of 20 dB; the dynamic tuning capability of a tuner is defined as the maximum to the minimum value of reflection factor generated.

Most important, FIG. 15 shows that, whereas the reflection factor at the fundamental frequency (fo) remains practically constant (point (123)), by withdrawing the 2fo and 3fo resonators, the reflection factor at 2fo (points (124, 126)) (at 3.6000 GHz) can be changed in amplitude between a maximum of −0.813 dB (point (117) in FIG. 13) and a minimum of −19.115 dB (point (126) in FIG. 15), and the value of the reflection factor at 3fo (5.4000 GHz) (points (125, 127) change by close to 28 dB (minimum value=−28.381 dB and maximum value −1.098 dB, point (118) in FIG. 13.

The results shown in FIGS. 13-16 demonstrate that the apparatus described in this document is a microwave tuning device, which is capable of generating independently controllable reflection factors both in amplitude and phase at three different frequencies, which can be selected to be three harmonic frequencies (fo, 2fo and 3fo) or alternatively, any other frequency in the range of the resonators made using the presented technology.

Figure 16:
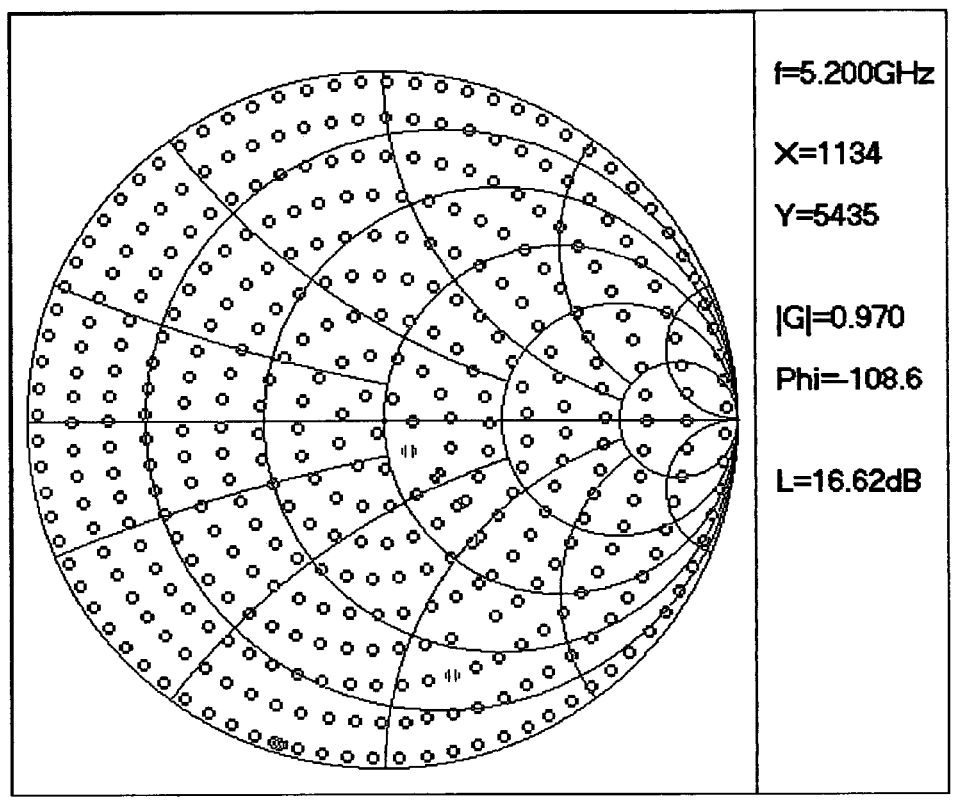
FIG. 16 depicts the calibration points of a three resonator frequency selective tuner at the third harmonic frequency of 5.2000 GHz. Horizontal movement of the resonator probe creates concentric circles, whereas the radius of the circles increases when approaching the probe to the central conductor of the slabline (FIGS. 7 and 10).
Figure 17:
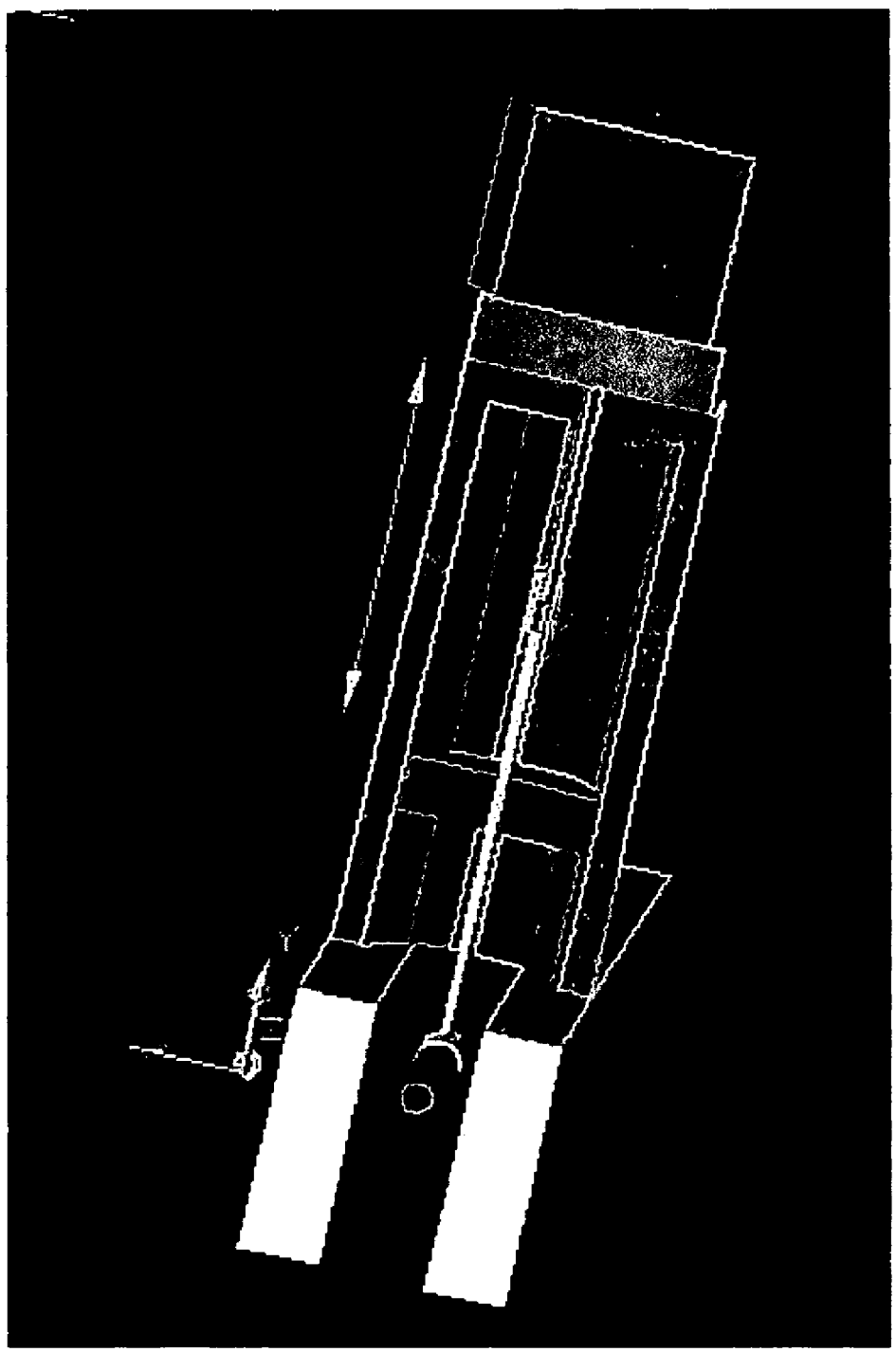
FIG. 17 depicts a perspective view of the core part of one section of the frequency selective tuner, showing the resonant cavity (23, FIG. 7), the resonator stab (115, FIG. 10), the vertical translation mechanism (51, 48, 50, FIG. 10) an the base of the resonator itself (58, FIG. 10), close to the central conductor (60, FIG. 10) of the slabline.
Figure 18:
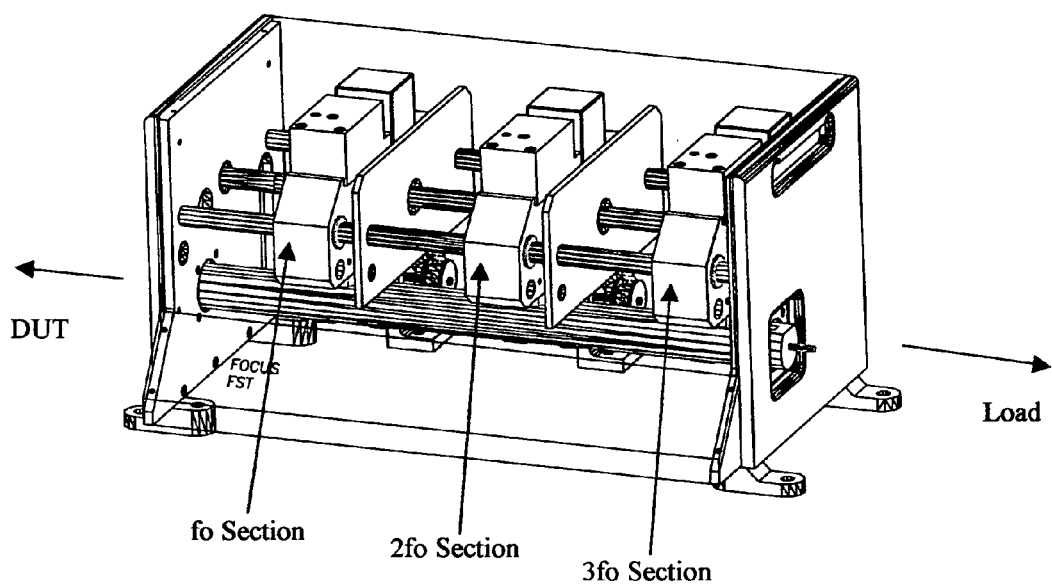
FIG. 18 depicts a perspective view of the three-resonator frequency selective tuner, shown also schematically in FIG. 11. The three separate tuning sections (104, 105, 106, FIG. 11) including resonator cavity, vertical and horizontal motors and horizontal drive screw are visible.

FIG. 16 depicts calibration points of a frequency selective tuner. The points marked on the Smith Chart correspond to reflection factors measured for different horizontal and vertical positions of the resonant probe. As the probe moves closer to the center conductor, the radius of the circles increases and as the probe moves horizontally, the calibration points move on a concentric circle, thus reaching any impedance on the Smith Chart, within the tuning range.

In order to make the described tuner useful for load pull or noise measurements, it has to be pre-characterized on a calibrated vector network analyzer (VNA) and saved on hard disk for later use (FIG. 19).

In the set-up of FIG. 19, used to calibrate the tuner, a control computer sends digital control signals to the motor control electronics of the tuner and sets its probes at certain pre-calculated positions. Once the probes are settled the control computer triggers readings of two-port S-parameters from the calibrated vector network analyzer (VNA). The data read from the VNA is then saved in a data file (calibration file) on the storage media of the control computer (hard-disk).

The calibration of the tuner has to be done for a great number of probe positions, in order to effectively cover the total area of the Smith Chart. For instance, if we want to cover every 5 degrees of phase and 0 to 1.0 in amplitude in 0.1 increments, we need at least 180 combinations of horizontal and vertical positions for each of the three probes. For the combination of all probes we need then 180×180×180=5,832,000 positions. Considering the data transfer time and the motor movement time, such a procedure is unrealistic.

We therefore propose a new calibration technique for this type of tuner. Using the same set-up as in FIG. 19 the following algorithm is used:

All probes are set to their initial positions, closest to the separation walls (107, 111, 112, FIG. 11) of the tuner.

The S-parameters of the tuner two-port are measured for the three harmonic frequencies of operation (fo, 2fo and 3fo) of the tuner and saved in a data file, named S0.

Then, while probes 2 and 3 rest at their initial position, probe 1 is moved to a pre-selected number of horizontal and vertical positions (in our example 180), in order to cover efficiently the total area of the Smith Chart at the fundamental frequency (fo). Each time the S-parameters are measured for the three harmonic frequencies, as previously, and saved in a second data file, named S1. File S1 is, in the case of our example, 180 times larger than file S0 (it includes data for 180 probe 1 positions).

Then probe 1 is returned to its initial position and probe 2 is moved to 180 combinations of horizontal and vertical positions, calculated in advance in order to cover efficiently the Smith Chart at 2fo. Each time the S-parameters are measured at the three harmonic frequencies, as before and saved in a third data file, named S2. This file has the same size as S1.

Then probe 2 is returned to its initial position and probe 3 is moved to 180 combinations of horizontal and vertical positions, calculated in advance in order to cover efficiently the Smith Chart at 3fo. Each time the S-parameters are measured at the three harmonic frequencies, as before and saved in a third data file, named S3. This file has the same size as S1 and S2.

The data stored in files S1, S2 and S3 are processed in memory of the control computer to generate the final tuner calibration files. This data processing consists of cascading, for each frequency point fo, 2fo and 3fo and for each probe 1 position, the S-parameters of files S2 and S3 with the inverse S-parameters of file S0 at all three harmonic frequencies fo, 2fo and 3fo and all corresponding probe 2 and probe 3 positions and replace the original data in files S2, and S3 with the new modified data.

This calibration algorithm requires measuring S-parameters of the tuner at a total of 3×180+1=541 probe positions (instead of 5,832,000), a task that can easily be accomplished in a fraction of one hour. Since all subsequent data manipulations and cascading of S-parameters saved in files S0-S3 are executed in the computer memory with virtually no time delay, this calibration method is very efficient.

I claim:

1. An electro-mechanical load pull tuner comprises a test port and an idle port, a slotted transmission airline (slabline) connecting both ports, a mobile carriage movable parallel to the slabline, said carriage comprising a resonant coaxial probe sliding perpendicularly on the slabline; the center conductor of said resonant probe is an open-ended stab capacitively coupled to the central conductor of the slabline; said tuner comprises means for horizontal movement of said carriage and vertical movement of said open-ended stab inside said resonant probe.

2. An electro-mechanical tuner as in claim 1, in which the coaxial adjustable resonant probe is made of a conductive cylinder cavity and a center conductor in form of a conductive open-ended stab; said stab is mounted isolated inside said cylinder cavity using isolating dielectric washers; one end of said stab, away from the slabline, is open and its other end, closest to the center conductor of the slabline, is attached to a semi-cylindrical metallic foil, said foil being shaped and aligned such as to create effective capacitive coupling between said stab and the center conductor of the slabline; the external wall of the cylindrical cavity slides on the top surface of the slabline and makes perfect and continuous electrical contact; said center stab is movable inside the external cylinder perpendicularly to the center conductor of said slabline; all movements are implemented using translation gear and electrical stepper motors.

3. An electro-mechanical tuner as in claim 2, in which the position of the open-ended stab inside the cylindrical cavity of said resonant probe can be adjusted in such a way as to allow for variable capacitive coupling between said semi-cylindrical foil at the lower end of said stab and the central conductor of the airline and permits to control the amplitude of the microwave reflection factor created by the open-ended stab.

4. An electro-mechanical tuner as in claim 3, in which the length of the central stab inside said resonant probe is cut to appropriate length in order to create a quarter wavelength resonance at a given frequency, said frequency being typically, but not necessarily, a harmonic frequency multiple of an operation fundamental frequency.

5. An electro-mechanical tuner as in claim 4, in which the horizontal distance of said resonant probe assembly from the test port of said tuner can be remotely adjusted in order to allow controlling the phase of the reflection factor presented at the test port of said tuner.

6. An electro-mechanical tuner as in claim 5, which includes up to three independent sections, each said section comprising one resonant probe and associated motion control which allows horizontal movement of said probe and vertical movement of said stub inside the resonant probe, the central stab of each probe being cut to appropriate length in order to create a quarter wavelength resonance at another frequency, said resonance frequencies being typically, but not necessarily, harmonic frequencies multiples of a fundamental frequency.

7. An electro-mechanical tuner as in claim 6, where remote digital electrical control of the horizontal and vertical position of the resonant probes is implemented using a control computer operating appropriate control software and electronic means for controlling the positions of stepper motors connected to appropriate gear, which moves the tuner carriages horizontally along the slabline and the central stabs inside the resonant probes perpendicularly to the slabline.

8. An electro-mechanical tuner, comprising a slotted airline, a test port and an idle port is divided in to three sections, each section comprising a mobile carriage, which comprises a resonant probe, inside of which there is a central open-ended stub, which is capacitively coupled with the central conductor of said airline, said tuner is calibrated by measuring scattering parameters (S-parameters) between the test and idle ports at a given frequency (fo) and its two harmonics (2fo and 3fo), as a function of the horizontal and vertical position of each resonant probe, using a calibrated vector network analyzer (VNA), and saved in a calibration data file; said calibration includes five steps, step 1 consisting of measuring S-parameters of the tuner as a function of the position of probe 1, probes 2 and 3 being initialized, step 2 consisting of measuring S-parameters of the tuner as a function of the position of probe 2, probes 1 and 3 being initialized, step 3 consisting of measuring S-parameters of the tuner as a function of the position of probe 3, probes 1 and 2 being initialized, step 4 consisting of cascading the S-parameters measured in steps 2 and 3 with the inverse S-parameters of the tuner, measured when all probes are initialized, and step 5 consisting of saving the S-parameters collected and calculated in steps 1 to 4 in a total of 9 calibration data files, one for each of 3 probes and each of 3 harmonic frequencies.

\* \* \* \* \*